United States Patent [19]

Schock

[11] 3,870,904

[45] Mar. 11, 1975

[54] CIRCUIT FOR CONTROLLING A THYRISTOR BY DIRECT CURRENT LOGIC

[75] Inventor: Delmas A. Schock, Euclid, Ohio

[73] Assignee: Mayfran Incorporated, Mayfield Village, Ohio

[22] Filed: May 21, 1973

[21] Appl. No.: 362,165

[52] U.S. Cl. ....... 307/252 B, 307/252 C, 307/252 N

[51] Int. Cl. ........................................... H03k 17/00

[58] Field of Search ........ 307/252 B, 252 C, 252 N; 323/225 C

[56] References Cited

UNITED STATES PATENTS

| | | | |
|---|---|---|---|
| 3,426,259 | 2/1969 | Ziehm | 307/252 B |
| 3,621,294 | 11/1971 | Cliff | 307/252 N |
| 3,743,860 | 7/1973 | Rossell | 307/252 B |

*Primary Examiner*—Stanley D. Miller, Jr.
*Assistant Examiner*—B. P. Davis

[57] ABSTRACT

There is provided a circuit for gating a thyristor semiconductor device used in switching alternating current. The thyristor has a conductive state when a signal of at least a first voltage is applied to its gate and a non-conductive state when a signal of a voltage below a second voltage is applied to the gate. The circuit includes an integrated circuit logic gate with an output having a low logic state and a high logic state. When in the low state, the thyristor is gated to the non-conductive condition by provision of a voltage drop device between the integrated circuit logic gate and the gate of the thyristor. Also, in the high logic state, there is provided an auxiliary current source to provide the necessary current to gate the thyristor into conduction even though the integrated circuit logic gates does not have sufficient current capacity.

3 Claims, 3 Drawing Figures

CIRCUIT FOR CONTROLLING A THYRISTOR BY DIRECT CURRENT LOGIC

This invention relates to the art of controlling a thyristor, such as a triac, and more particularly to a device for controlling the transistor in accordance with direct current logic.

This invention is particularly applicable for controlling a triac by direct current logic for an inductive load, such as a motor, and it will be described with particular reference thereto; however, it must be appreciated that the invention has much broader applications and may be used for other types of thyristors, such as silicon controlled rectifiers, for various types of alternating current loads.

When an inductive load, such as a motor, is being controlled by a direct current logic circuit, it has been somewhat common practice to actuate the motor circuit by a reed relay.

In doing this, it is necessary to provide amplification of the direct current logic to furnish the necessary voltage for controlling the relay. This is a costly and somewhat inefficient manner of controlling an alternating current motor by the logic output of a direct current circuit. Attempts to control a thyristor, such as the triac or SCR, by the normal output of a direct current logic gate have met with substantial difficulties. The logic gate would often not provide sufficient current for gating the thyristor into conduction. In addition, many times the direct current logic gate, in its low logic state, would not have a voltage level sufficiently low to cause non-conduction of the thyristor. These two difficulties have been overcome by the present invention which relates to a circuit for connecting a standard direct current logic gate, having a high and low logic state, onto the gate of a thyristor in a manner to allow positive control of the thyristor without concern for variations in the logic gate which could cause malfunction of the prior control circuits.

In accordance with the present invention, there is provided a direct current circuit for gating a thyristor semiconductor device used in switching alternating current. The thyristor has a conductive state when a signal having at least a first voltage and at least a given current is applied to its gate and a non-conductive state when a signal having a voltage below a second voltage is applied to the gate. The direct current circuit, in accordance with the invention, includes an integrated circuit logic gate with an output having a low logic state with a first output voltage above the second voltage but less than a third voltage. When in the high logic state, the logic gate produces second output voltage exceeding the first gating voltage of the thyristor by at least substantially more than the first voltage but a low output current insufficient to gate the thyristor into conduction. As so far described, the integrated logic gate could not operate the thyristor consistently. In accordance with the invention, there is provided circuit means for connecting the logic gate output to the gate of the thyristor. This circuit means includes a voltage drop element with a maximum voltage drop of approximately the third voltage and a voltage source means connected to the circuit means between the logic gate output and the voltage drop element for providing current to the circuit means. The provided current and the output current of the logic gate, when in the high state, exceeds the minimum current necessary for gating the thyristor into conduction.

By using this circuit interconnecting a standard direct current logic gate and a thyristor having the normal gating characteristics, there is a positive control of the thyristor by the logic gate when it shifts between its high and low states. In the low state, the voltage drop element applies a substantially zero voltage to the thyristor gate because the output of the logic gate is below the rated voltage of the voltage drop element. This positively forces the thyristor into a non-conducting condition. When the logic gate is in a high logic state, the output voltage of the logic gate exceeds the rating of the voltage drop element by a sufficient amount to gate the thyristor. To provide the necessary gating current, an auxiliary voltage source is provided. This introduces an additional current to the gating circuit for developing the proper gating current. In this manner, there is a positive gating of the thyristor to the conductive condition when the logic gate is in its high state.

The primary object of the present invention is the provision of a circuit for converting direct current logic to an alternating current control without limitations normally found in such circuits.

Another object of the present invention is the provision of a circuit for converting a direct current logic into an alternating current control function, which circuit assures positive switching of the alternating current control function in accordance with shifting of the direct current logic.

A further object of the present invention is the provision of a circuit as explained above which can be easily connected to known components and is inexpensive and requires little maintenance.

These and other objects and advantages will become apparent from the following description taken together with the accompanying drawings in which.

Figure 1:
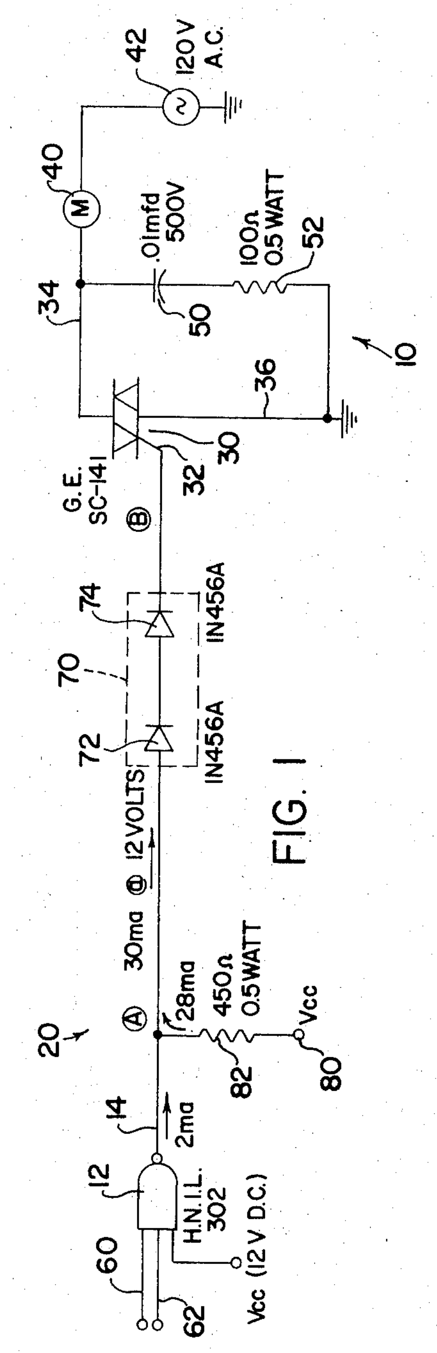
FIG. 1 is a schematic wiring diagram illustrating the preferred embodiment of the present invention.

Referring now to the drawings wherein the showings are for the purpose of illustrating the preferred embodiment of the invention only, and not for the purpose of limiting same, FIG. 1 shows an alternating current motor control circuit 10 controlled by a direct current logic gate 12, in the form of a NAND gate, with an output 14 connected to the motor control circuit 10 by connecting circuit 20. The logic from gate 12 and output 14 controls the motor circuit 10.

Referring now in more detail to the motor control circuit 10, this circuit includes a thyristor which may be a triac or silicon controlled rectifier. In accordance with the preferred embodiment of the invention, the thyristor is a triac of the type sold by General Electric Company under No. SC–141. This triac has the standard gate 32 and main terminals 34, 36 which are connected to ground and through an inductive load 40 to an alternating current supply 42. In accordance with the preferred embodiment of the invention, the inductive load is a motor; however, it can be other controlled components, such as a solenoid of a hydraulic system or a starter for a motor, to name only a few. Since the load 40 is inductive, a capacitor 50 is connected in parallel with the triac 30 and in series with a relatively small resistor 52. The values of the electrical components are found on FIG. 1.

The logic gate 12 is a high noise immunity logic gate of the type designated as No. 15302 by Texas Instruments. The inputs 60, 62 receive digital logic to control the logic at output 14. In accordance with normal practice, a 12 volt supply is connected at the Vcc terminal of gate 12. This results in a positive logic wherein the high logic state is approximately 12 volts and a low logic state is approximately zero. Of course, this logic gate could be the type operated on negative logic wherein the terminal Vcc would be a negative voltage. The particular level of voltage is not important; however, the 12 volt logic is adapted for operating a triac. To do this, the output voltage in the high logic state is sufficient to provide the necessary gating voltage for the triac. In practice, the voltage at the low logic state generally does not reach zero potential. It has been found that the output voltage during the low logic state is approximately 0.8 volts for the gates used in the preferred embodiment.

Referring now in more detail to the connecting circuit 20 which forms the present invention, the line coupling output 14 with gate 32 includes a voltage drop element 70 which, in the preferred embodiment, includes two diodes 72, 74 each of which is marketed under the Number IN 456. These diodes each have a voltage drop of approximately 0.6 volts. Consequently, the two diodes polarized in the same direction will present a voltage drop, or breakdown voltage, of approximately 1.2 volts direct current. As long as the voltage at point A to the left of the diodes is less than 1.2 volts, the voltage at point B to the right of the diodes is zero volts. This maintains a zero volt condition on gate 32 until the voltage to the left of the diodes exceeds 1.2 volts. The purpose of this relationship will be explained later.

Between the output 14 and the voltage drop element 70 there is provided an additional current supply formed from a voltage source 80 and a resistor 82. In accordance with the illustrated embodiment of the invention, the voltage source is the standard 12 volt supply voltage Vcc. Resistor 82 has a rating of 450 ohms; therefore, the voltage source will provide approximately 28 ma of current to the gate 32 during the gating operation.

Figure 2:
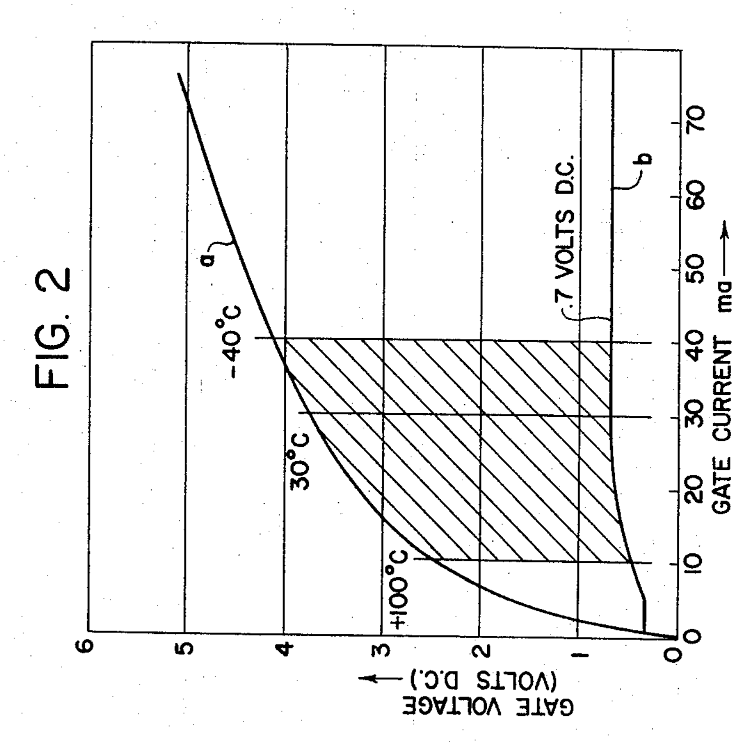
FIG. 2 is a graph illustrating the general gating characteristics of the thyristor illustrated in FIG. 1; and, FIG. 3 is a chart illustrating certain voltage aspects of the preferred embodiment of the present invention as illustrated in FIG. 1.

Referring now to FIG. 2, there is illustrated the general gating characteristics of a triac. The upper line a represents a minimum gating signal which will cause conduction to the triac. Values above line *a* will cause gating at the various temperatures. The lower line *b* represents a minimum level below which a gating signal is insufficient to keep the thyristor conductive. The curves are temperature responsive. The shaded area is the operation of the triac between −40°C and +100°C. In this area the gating is somewhat uncertain. The voltages for a given triac may vary somewhat due to manufacturing tolerances. Assuming that a triac functions in accordance with FIG. 2 and the thyristor is operating at approximately 25°C, the current necessary for gating the thyristor to conduction will be approximately 30 ma. The voltage will be above approximately 3 ½ volts. If the gating voltage drops below approximately 0.6 volts, the thyristor is no longer conductive. From this chart, which is representative of the general operating characteristics of a thyristor, and especially a triac, it is seen that a given current is necessary to render the thyristor conductive irrespective of the applied gating voltage. Below a certain voltage, the thyristor becomes non-conductive irrespective of the current flow. These characteristics will now be utilized in explaining the operation of the preferred embodiment illustrated in FIG. 1.

Figure 3:
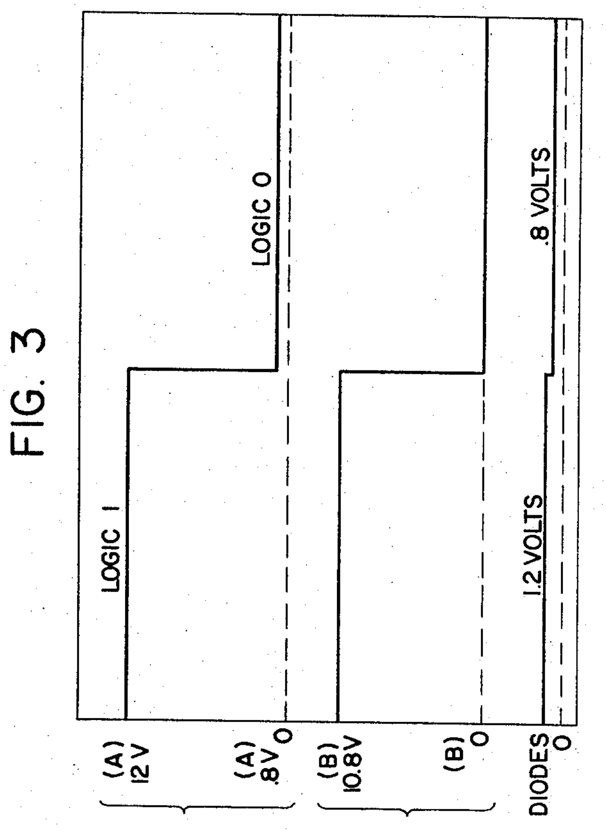

As shown at the right of FIG. 3, when the inputs 60, 62 are such that the output 14 of logic gate 12 is a low logic, there is generally a residual voltage at output 14, i.e., point A. This residual voltage is approximately 0.8 volts. As illustrated in FIG. 2, a residual voltage of 0.8 volts is insufficient to turn off the triac. However, the voltage at point B, to the right of voltage drop element 70, is a zero voltage because the 0.8 residual voltage at the low logic state is insufficient to overcome the voltage drop of 1.2 volts across the element 70. Consequently, there is a positive turn off of the triac when the gate 12 is in the low logic condition. Of course, it is possible to use a Zener type element for element 70, if desired.

When the inputs 60, 62 shift the output 14 to a high logic state, the gate attempts to create a voltage of approximately 12 volts at point A. This output voltage produces a voltage of approximately 10.8 volts at point B. However, as shown in the chart of FIG. 2, the mere existence of a high gating voltage is not sufficient to cause gating of the triac. It is necessary to provide a relatively high current also. In practice, the turn on voltage for the triac is 2.5 volts and the gating current is approximately 30 ma. The logic gate 12, when using a No. 15302 NAND gate, is an open collector gate. Consequently, there is no internal pull up resistor. Thus, a relatively low amount of current in the range of 2 ma, is provided at output 14. To provide the necessary additional gating current, in accordance with the invention, the voltage source 80 produces approximately 28 ma through the resistor 82. This 28 ma, added to the 2 ma from output 14 produces a 30 ma gating signal at approximately 12 volts. This is sufficient to gate the triac into conduction. Such a condition is shown at the left in FIG. 3. In this aspect of the invention, gate 12 has insufficient current to gate the triac. Source 80 produces the needed additional current. Various gates have this low current output at the high logic state to utilize the auxiliary current source. Voltage across the diode is 1.2 volts and the voltage at point B is 10.8 volts. The voltage at source 80 is approximately the same as the output voltage. If not, they would balance at a position substantially above the gating voltage of 2.5 volts for the particular triac used in accordance with the illustrated embodiment of the present invention.

When the output 14 is at low logic, point A is clamped to the low logic; therefore, a major portion of the 12 volts from source 80 appears across the resistor 82. This prevents gating by the auxiliary power connection 80 in the circuit illustrated in FIG. 1. Diodes 72, 74 do not hinder this voltage dividing effect which will assure that the point A, at the low level logic state, is at approximately the residual voltage from the direct current logic gate 12.

Having thus defined my invention I claim:

1. A direct current circuit for gating a triac used to switch alternating current applied across said triac, said triac having a gate and being in a conductive state when a signal of at least a first voltage and at least a given current is applied to said gate of said triac and a non-conductive condition when a signal of a voltage below a second voltage is applied to said gate, said direct current circuit comprising:

a. a logic gate with an output having a low logic state having a first output voltage above said second voltage and insufficient to positively render said triac non-conductive when said logic gate is shifted to its low logic state and said first output voltage created during the low logic state of said logic gate being less than a third voltage, said logic gate having a high logic state with a second output voltage above said first voltage by at least substantially more than said third voltage to provide a sufficient voltage to render said triac conductive and the output current of said logic gate during said high logic state being less than said given current to provide insufficient current to render said triac conductive;

b. circuit means for connecting said logic gate output to said gate of said triac, said circuit means including a voltage drop element connected between said logic gate output and said triac gate and having a maximum voltage drop of approximately said third voltage; and, c. a current source connected to said logic gate output and between said logic gate output and said voltage drop element for providing additional current to said circuit means, said provided current being added to said output current of said logic gate when in said high state to provide a current summation having a value at least as great as said given current to render said triac conductive when said logic gate is in said high logic state.

2. A direct current circuit as defined in claim 1 wherein said voltage drop element is at least one diode.

3. A direct current circuit as defined in claim 1 wherein said current source includes a voltage source approximately equal in magnitude to said second output voltage and a current controlling resistor between said voltage source and said logic gate output.

* * * * *